United States Patent
Chen et al.

(10) Patent No.: US 7,286,388 B1
(45) Date of Patent: Oct. 23, 2007

(54) RESISTIVE MEMORY DEVICE WITH IMPROVED DATA RETENTION

(75) Inventors: An Chen, Sunnyvale, CA (US); Sameer Haddad, San Jose, CA (US); Tzu-Ning Fang, Palo Alto, CA (US); Yi-Ching Jean Wu, Sunnyvale, CA (US); Colin S. Bill, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 82 days.

(21) Appl. No.: 11/165,005

(22) Filed: Jun. 23, 2005

(51) Int. Cl.
G11C 13/00 (2006.01)

(52) U.S. Cl. ..................... 365/151; 365/148

(58) Field of Classification Search ............... 365/151, 365/148
See application file for complete search history.

(56) References Cited

U.S. PATENT DOCUMENTS

2004/0160801 A1* 8/2004 Krieger et al. ............. 365/151
2006/0245235 A1* 11/2006 Krieger et al. ............. 365/115
2006/0256608 A1* 11/2006 Chen et al. ................ 365/148

OTHER PUBLICATIONS

Reproducible switching effect in thin oxide films for memory applications, A. Beck, J. G. Bednorz, Ch. Gerber, C. Rossel, D. Widmer, Applied Physics Letters, vol. 77, No. 1, Jul. 3, 2000, pp. 139-141.

The role of space-charge-limited-currentconduction in evaluation of the electrical properties of thin Cu2O films, A. E. Rakhshani, J. Appl. Phys. 69(4), Feb. 15, 1991, pp. 2365-2368.

Hysteretic current-voltage characteristics and resistance switching at an epitaxial oxide Schottky junction SrRuO3/SrTi0.99Nb0.01)3,T. Fuji, M. Kawasaki, A. Sawa, H. Akoh, Y Kawazoe, Y. Tokura, Applied Physics Letters 86, 012107(2005),Dec. 23, 2004, pp. 1-3.

Current-driven insulator-conductortransition and nonvolatile memory in chromium-doped SrTiO3 single crystals, Y. Watanbe, J. G. Berdnoz, A. Bietsch, Ch. Gerber, D. Widmer, A. Beck, S. J. Wind, Applied Physics Letter, vol. 78, No. 23, Jun. 4, 2001, pp. 3738-3740.

* cited by examiner

Primary Examiner—Huan Hoang (57) ABSTRACT

In the present method of programming a memory device from an erased state, the memory device includes first and second electrodes, a passive layer between the first and second electrodes, and an active layer between the first and second electrodes. In the programming method, (i) an electrical potential is applied across the first and second electrodes from higher to lower potential in one direction to reduce the resistance of the memory device, and (ii) an electrical potential is applied across the first and second electrodes from higher to lower potential in the other direction to further reduce the resistance of the memory device.

17 Claims, 6 Drawing Sheets

RESISTIVE MEMORY DEVICE WITH IMPROVED DATA RETENTION

BACKGROUND OF THE INVENTION

1. Technical Field

This invention relates generally to memory devices, and more particularly, to resistive memory device operation and resistive memory structure.

2. Background Art

The volume, use and complexity of computers and electronic devices are continually increasing. Computers consistently become more powerful, new and improved electronic devices are continually developed (e.g., digital audio players, video players). Additionally, the growth and use of digital media (e.g., digital audio, video, images, and the like) have further pushed development of these devices. Such growth and development has vastly increased the amount of information desired/required to be stored and maintained for computer and electronic devices.

Generally, information is stored and maintained in one or more of a number of types of storage devices. Storage devices include long term storage mediums such as, for example, hard disk drives, compact disk drives and corresponding media, digital video disk (DVD) drives, and the like. The long term storage mediums typically store larger amounts of information at a lower cost, but are slower than other types of storage devices. Storage devices also include memory devices, which are often, but not always, short term storage mediums. Memory devices tend to be substantially faster than long term storage mediums. Such memory devices include, for example, dynamic random access memory (DRAM), static random access memory (SRAM), double data rate memory (DDR), flash memory, read only memory (ROM), and the like. Memory devices are subdivided into volatile and non-volatile types. Volatile memory devices generally lose their information if they lose power and typically require periodic refresh cycles to maintain their information. Volatile memory devices include, for example, random access memory (RAM), DRAM, SRAM and the like. Non-volatile memory devices maintain their information whether or not power is maintained to the devices. Non-volatile memory devices include, but are not limited to, ROM, programmable read only memory (PROM), erasable programmable read only memory (EPROM), flash memory and the like. Volatile memory devices generally provide faster operation at a lower cost as compared to non-volatile memory devices.

Memory devices generally include arrays of memory cells. Each memory cell can be accessed or "read", "written", and "erased" with information. The memory cells maintain information in an "off" or an "on" state, also referred to as "0" and "1". Typically, a memory device is addressed to retrieve a specified number of byte(s) (e.g., 8 memory cells per byte). For volatile memory devices, the memory cells must be periodically "refreshed" in order to maintain their state. Such memory devices are usually fabricated from semiconductor devices that perform these various functions and are capable of switching and maintaining the two states. The devices are often fabricated with solid state technology, such as, crystalline silicon devices. A common semiconductor device employed in memory devices is the metal oxide semiconductor field effect transistor (MOSFET).

The use of portable computer and electronic devices has greatly increased demand for non-volatile memory devices. Digital cameras, digital audio players, personal digital assistants, and the like generally seek to employ large capacity non-volatile memory devices (e.g., flash memory, smart media, compact flash, and the like).

Because of the increasing demand for information storage, memory device developers and manufacturers are constantly attempting to increase storage capacity for memory devices (e.g., increase storage per die or chip). A postage-stamp-sized piece of silicon may contain tens of millions of transistors, each transistor as small as a few hundred nanometers. However, silicon-based devices are approaching their fundamental physical size limits. Conventional solid state devices are generally encumbered with a complex architecture which leads to high cost and a loss of data storage density. The volatile semiconductor memories must constantly be supplied with electric current with a resulting heating and high electric power consumption in order to maintain stored information. Non-volatile semiconductor devices have a reduced data rate and relatively high power consumption and large degree of complexity. Typically, fabrication processes for such cells are also not reliable.

Therefore, there is a need to overcome the aforementioned deficiencies.

Figure 1:
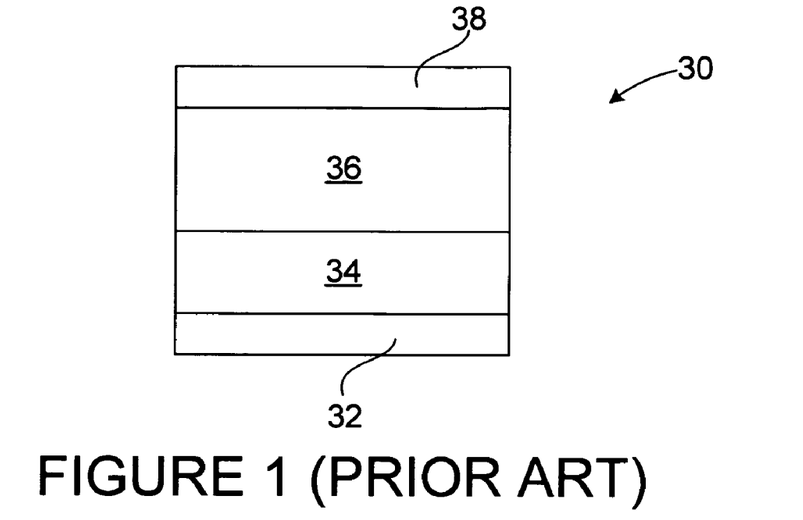
FIG. 1 is a cross-sectional view of an above-described memory device.

FIG. 1 illustrates a type of memory device 30, which includes advantageous characteristics for meeting these needs. The memory device 30 includes an electrode 32 (for example copper), a copper sulfide layer 34 on the electrode 32, an active layer 36, for example a copper oxide layer, on the layer 34, and an electrode 38 (for example titanium) on the active layer 36. Initially, assuming that the memory device 30 is unprogrammed, in order to program the memory device 30, ground is applied to the electrode 38, while a positive voltage is applied to electrode 32, so that an electrical potential $V_{pg}$ (the "programming" electrical potential) is applied across the memory device 30 from a higher to a lower electrical potential in the forward direction of the memory device 30 (see FIG. 2, a plot of memory device current vs. electrical potential applied across the memory device 30). This potential is sufficient to cause copper ions to be attracted from the layer 34 toward the electrode 38 and into the active layer 36 (A) so that conductive filaments are formed, causing the active layer 36 (and the overall memory device 30) to be in a (forward) low-resistance or conductive state. Upon removal of such potential (B), the ions drawn into the active layer 36 during the programming step remain therein, so that the active layer 36 (and memory device 30) remain in a conductive or low-resistance state.

In the read step of the memory device 30 in its programmed (conductive) state, an electrical potential $V_r$ (the "read" electrical potential) is applied across the memory device 30 from a higher to a lower electrical potential in the forward direction of the memory device 30. This electrical potential is less than the electrical potential $V_{pg}$ applied across the memory device 30 for programming (see above). In this situation, the memory device 30 will readily conduct current, which indicates that the memory device 30 is in its programmed state.

Figure 2:
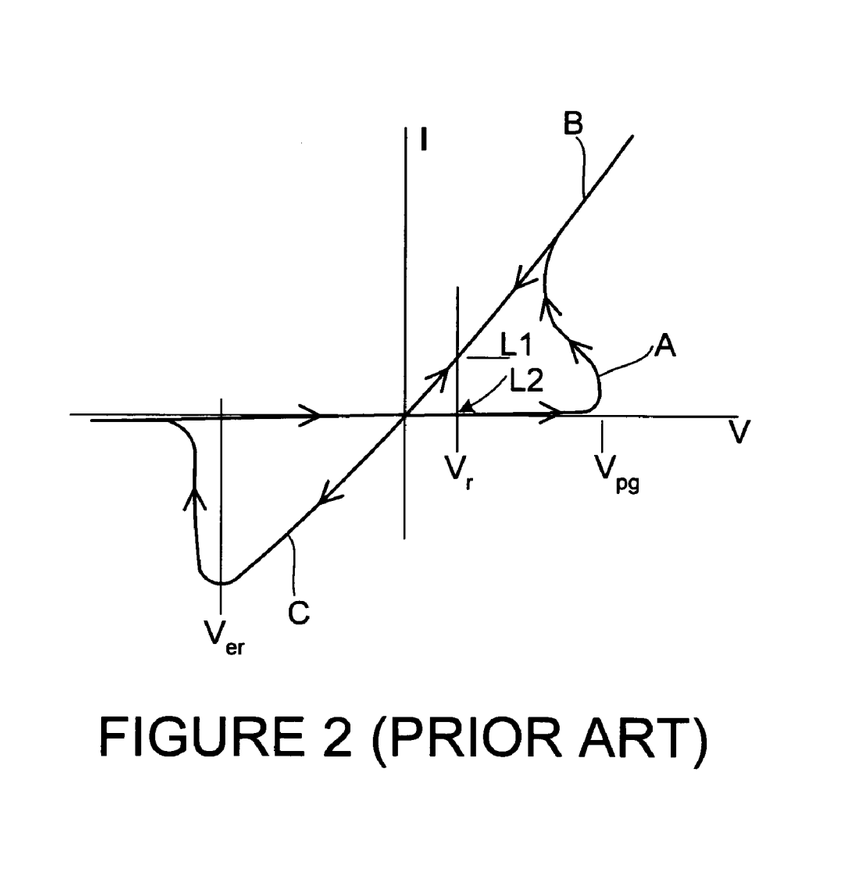
FIG. 2 is a plot of current vs. voltage illustrating operating characteristics of the memory device of FIG. 1.

In order to erase the memory device, a positive voltage is applied to the electrode 38, while the electrode 32 is held at ground, so that an electrical potential Ver (the "erase" electrical potential) is applied across the memory device 30 from a higher to a lower electrical potential in the reverse direction of the memory device 30. This potential is sufficient to cause copper ions to be repelled from the active layer 36 toward the electrode 32 and into the layer 34 (C), causing the active layer 36 (and the overall memory device 30) to be in a high-resistance or substantially non-conductive state. This state remains upon removal of such potential from the memory device 30.

In the read step of the memory device 30 in its erased (substantially non-conductive) state, the electrical potential $V_r$ is again applied across the memory device 30 from a higher to a lower electrical potential in the forward direction of the memory device 30, as described above. With the active layer 36 (and memory device 30) in a high-resistance or substantially non-conductive state, the memory device 30 will not conduct significant current, which indicates that the memory device 30 is in its erased state.

It will be understood that it is highly desirable that the memory device, when programmed, be capable of retaining its programmed state for a long period of time, i.e., until it is desired that the state be changed to its erased state. While the above described device is effective in operation, it has been found that over a period of time, the conductive filaments formed in the programmed device can break down, causing the conductivity of the memory device to be significantly reduced, so that the memory device undesirably loses its programmed state.

The memory device as thus far shown and described is capable of adopting two states, i.e., a first, conductive state, or "on" state, and a second, substantially non-conductive, or "off" state. Each memory device thus can include information as to the state of a single bit, i.e., either 0 or 1. However, it would be highly desirable to be able to provide a memory device which is capable of adopting any of a plurality of states, so that, for example, in the case where four different states of the memory device can be adopted, two bits of information can be provided as chosen (for example first state equals 00, second state equals 01, third state equals 10, fourth state equals 11). This multi-level (ML) memory technology can significantly improve memory density and reduce cost per bit.

DISCLOSURE OF THE INVENTION

Broadly stated, in the present method of programming a memory device from an erased state, the memory device comprising first and second electrodes, a passive layer between the first and second electrodes, and an active layer between the first and second electrodes, the method comprises applying a first electrical potential across the first and second electrodes to reduce the resistance of the memory device, and applying a second electrical potential across the first and second electrodes to further reduce the resistance of the memory device.

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

BEST MODE(S) FOR CARRYING OUT THE INVENTION

Reference is now made in detail to a specific embodiment of the present invention which illustrates the best mode presently contemplated by the inventors for practicing the invention.

Reference is made to the paper "The role of space-charge-limited-current conduction in evaluation of the electrical properties of thin $Cu_2O$ films", A. E. Rakhshani, J. Apl. Phys. 69(4), 15 Feb. 1991, pages 2365-2369, incorporated by reference herein.

Figure 3:
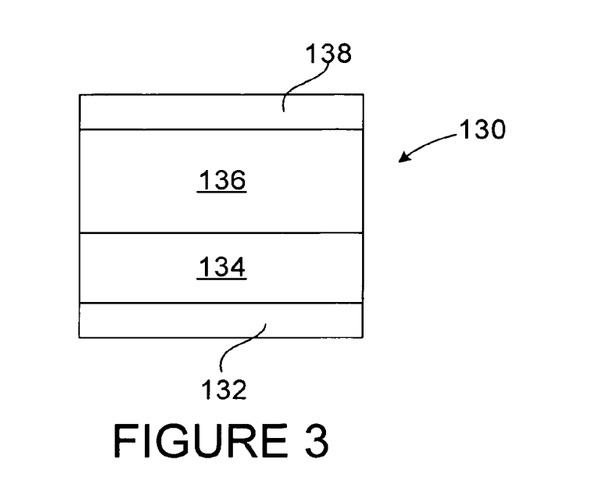
FIG. 3 is a cross-sectional view of an embodiment of the present memory device.

The present approach is different from the ionic switching approach of the prior art in a manner that will be described. FIG. 3 illustrates a first embodiment of memory device 130 for use in the present invention. Initially, a copper electrode 132 is formed. The surface thereof is sulfidized using $H_2S$, elemental S or aqueous Ammonium Sulfate to form a 20-100 angstroms thick $Cu_2S$ passive layer 134 on and in contact with the electrode 132. The surface of the layer 134 is oxidized to form a 30-200 angstroms thick copper oxide active layer 136 on and in contact with the passive layer 134. A titanium electrode 138 is formed on and in contact with the active layer 136 by for example DC or RF sputtering or by evaporation. FIG. 3 illustrates the fabricated memory device 130, wherein the layers 134, 136 are formed between the electrodes 132, 138.

Figure 4:
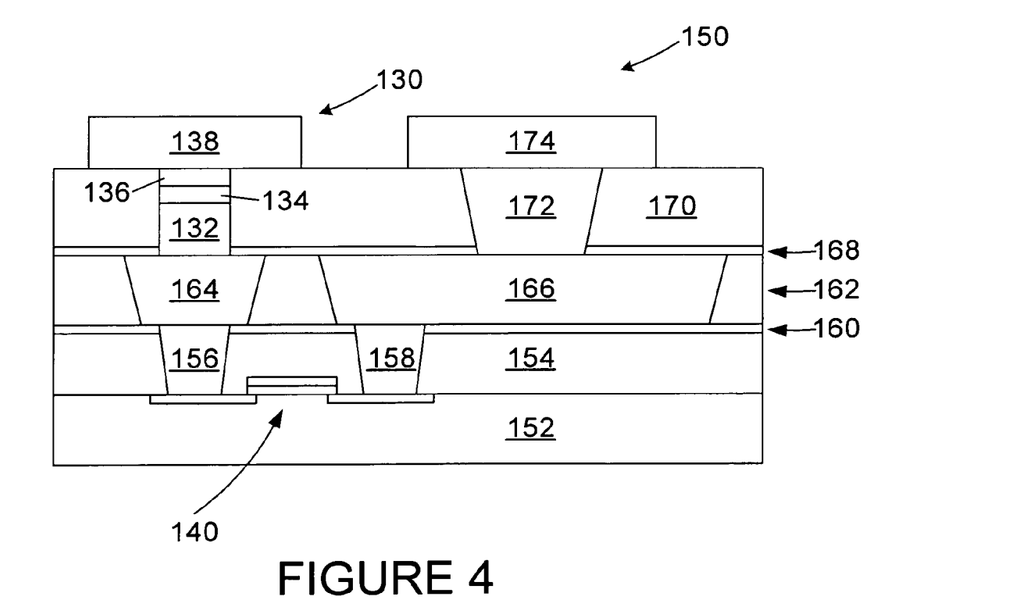
FIG. 4 is a cross-sectional view of the memory device of FIG. 3 as part of an integrated circuit.

FIG. 4 illustrates the memory device 130 as part of a larger electronic structure 150. The structure 150 includes a semiconductor substrate 152 having formed therein the source and drain of a transistor 140. Provided on the substrate 152 is a dielectric layer 154, which in turn has a nitride layer 160 thereon. Copper plugs 164, 166 extend through the dielectric and nitride layers 154, 160 and contact the source and drain of the transistor 140.

Overlying this structure is another dielectric layer 162. Copper plugs 164, 166 extend through the dielectric layer 162 and contact the copper plugs 156, 158 respectively. A nitride layer 168 is provided on the resulting structure, and a dielectric layer 170 is provided on the nitride layer 168. A copper plug 172 extends through the nitride and dielectric layers 168, 170 and contacts the copper plug 166. The electrode 132, passive layer 134, and active layer 136, in a stacked configuration, extend through the nitride and dielectric layers 168, 170, the electrode 132 contacting the copper plug 164. Electrode 138 is formed on the active layer 136, so that the overall memory device 130 is formed. An electrode 174 is formed in contact with the copper plug 172.

It will be seen that the memory device 130 is connected in series with the transistor 140, which is a select transistor for that memory device. FIGS. 5-8 illustrate this configuration and also illustrate the present method.

Figure 5:
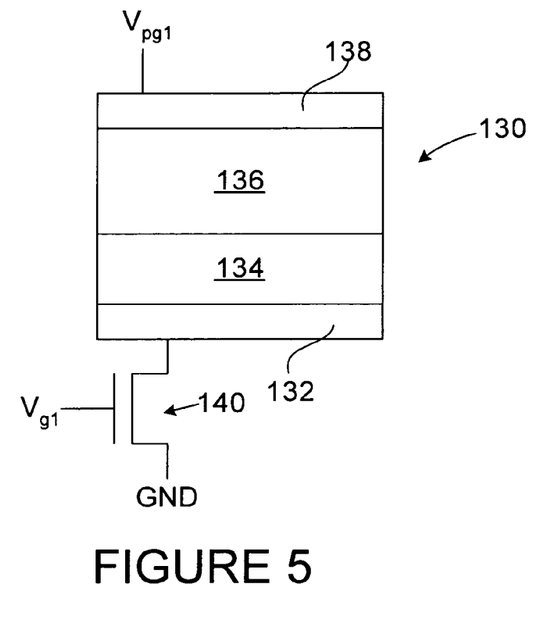
FIGS. 5-8 illustrate programming of the memory device of FIG. 3 in accordance with the present method.
Figure 6:
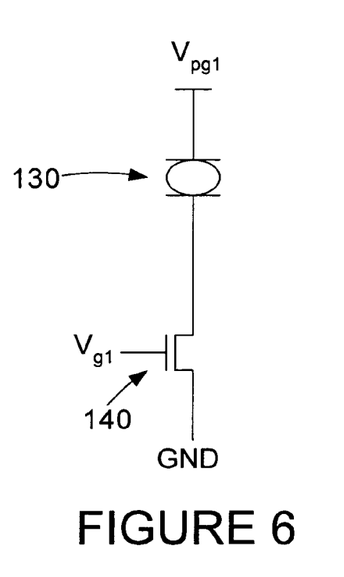
Figure 7:
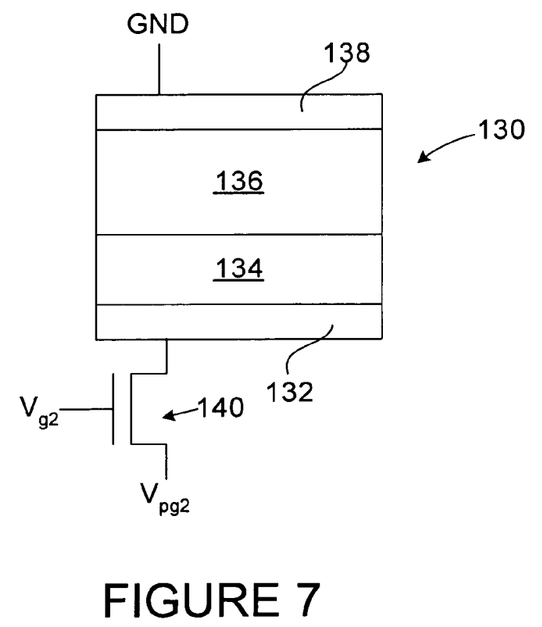
Figure 8:
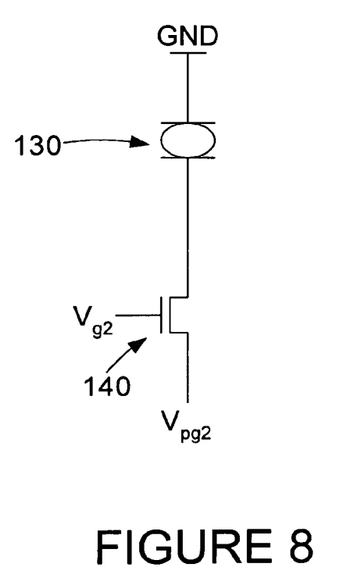

The programming of the memory device 130 from its high resistance, erased state involves two successive programming steps, the first step illustrated in FIGS. 5 and 6, and the second step illustrated in FIGS. 7 and 8. In the first step of programming the memory device 130 (FIGS. 5 and 6), a positive voltage $V_{pg1}$ is applied to the electrode 138, while the source of the transistor 140 is connected to ground, so that an electrical potential is applied across the electrodes 138, 132 from a higher to a lower potential in the direction from the electrode 138 to the electrode 132 (and in the direction from active layer 136 to the passive layer 134). The voltage $V_{g1}$ applied to the gate of the transistor 140 is set to a level so as to limit current through the device 130 during the first programming operation. In this particular embodiment, voltage $V_{pg1}$ is ramped from 0 volts to 4.0 volts, while $V_{g1}$ is set at 2.0 volts, limiting current ($I_1$) to approximately 40 μA. This first programming step causes the active layer 136 (and the overall memory device 130) to adopt and be in a first low-resistance state, i.e., resistance reduced from the erased state. While the mechanism involved is not completely understood, it is believed that first programming step mechanism is as follows:

It is believed that the first programming step causes electronic charge carriers, i.e., electrons and/or holes, to move into and be held by preexisting traps in the active layer 136, such traps being formed by the manufacturing process described above. The electronic charge carriers may be electrons, holes, or a combination of electrons and holes. Upon removal of such potential, the electronic charge carriers drawn into the active layer 136 during the first programming step remain in and are held by the deep traps, so as to remain in the active layer 136, so that the active layer 136 (and memory device 130) remain in a first low-resistance state.

Figure 9:
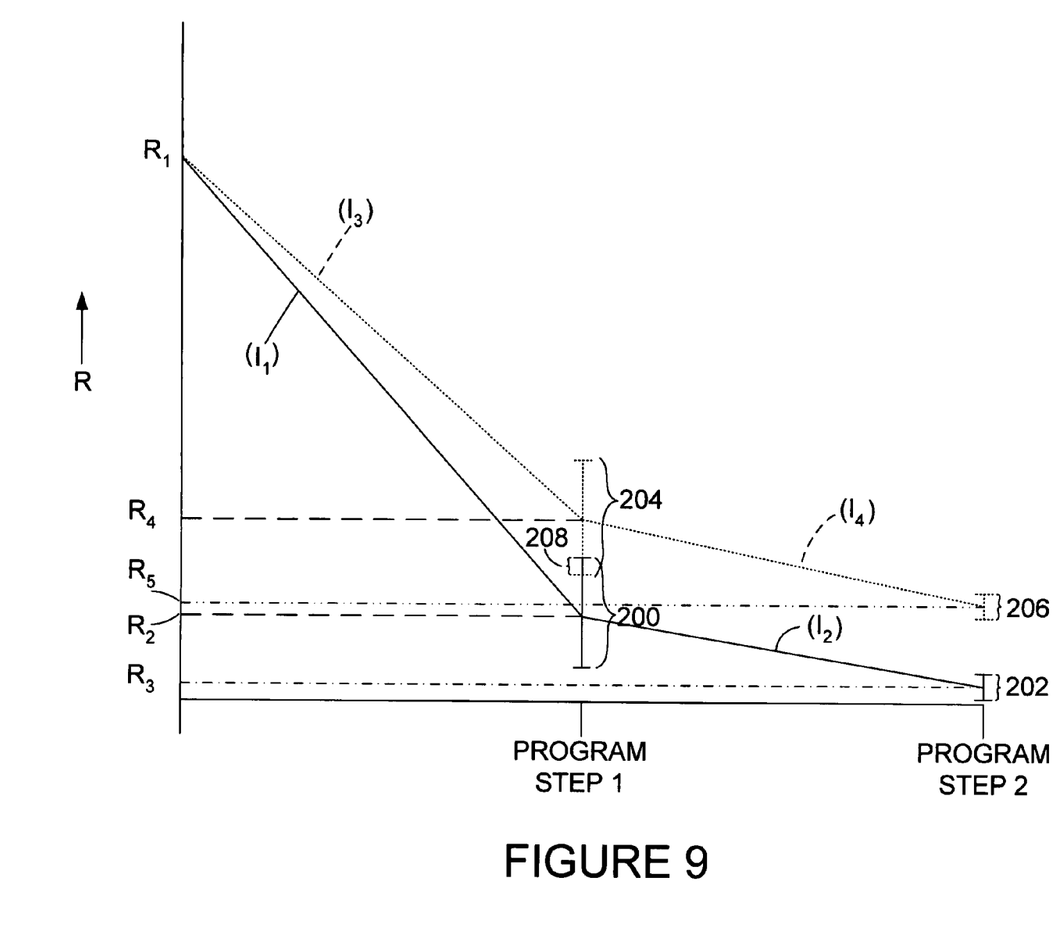
FIG. 9 is a plot illustrating resistance of the memory device of FIG. 3 when undertaking the programming thereof.

As noted, this first programming step causes the resistance of the memory device 130 to be substantially reduced (increasing the conductivity of the memory device 130), as illustrated in FIG. 9, dropping from resistance $R_1$ (erased state, prior to the first programming step) to $R_2$ (first programming step having been undertaken).

In the second step of programming the memory device 130 (FIGS. 7 and 8), the electrode 138 is connected to ground, while a positive voltage $V_{pg2}$ is applied to the source of the transistor 140, so that an electrical potential is applied across the electrodes 138, 132 from a higher to a lower potential in the direction from the electrode 132 to the electrode 138 (and in the direction from passive layer 134 to the active layer 136). The voltage $V_{g2}$ applied to the gate of the transistor 140 is set to a level so as to limit current through the memory device 130 during the second programming step. In this particular embodiment, voltage $V_{pg2}$ is ramped from 0 volts to 1.4 volts, while $V_{g2}$ is set at 4.0 volts, limiting current ($I_2$) to approximately 100 μA. This second programming step causes the resistance of the active layer 136 (and overall memory device 130) to adopt and be in a second, further reduced state. While again the mechanism involved is not completely understood, it is believed that second programming step mechanism is as follows:

It is believed that the second programming step causes charged copper ions to move from the passive layer 134 into the active layer 136, causing the resistance of the memory device 130 to be further reduced (further increasing the conductivity of the memory device 130), as illustrated in FIG. 9, resistance dropping from resistance $R_2$ (first programming step having been undertaken) to $R_3$ (second programming step having been undertaken).

While it will be seen that the first step of the programming process causes the memory device 130 to adopt a low-resistance, i.e., high conductivity state, the inclusion of the successive second step of the programming process provides significant advantages. It will be understood, for example, that during the programming operation, in an array of memory cells, many individual memory devices 130 will be programmed. As will be understood, because of for example slight physical differences between individual memory devices 130, the memory devices 130 will not have exactly the same resistance, i.e., each resistance will not be exactly equal to $R_2$, but rather there will be a variation range of resistances from memory device to memory device, with the resistance of each memory device falling somewhere within this variation range. The resistance $R_2$ is actually the mean resistance value of these various resistances. It has been found that after this first programming step, while a mean resistance $R_2$ for the memory devices 130 has been achieved, the variation range of resistance from memory device to memory device, shown at 200, is relatively large, indicating a substantial variation in the actual resistance from memory device to memory device.

Inclusion of the second programming step not only causes resistance to be further reduced, achieving a mean resistance $R_3$ which is lower than mean resistance $R_2$, but also causes the variation range of resistance, indicated at 202, to be greatly reduced (compare variation range 200), so that the variation in actual resistance from memory device to memory device is substantially reduced. Thus, by undertaking this two-step programming operation, great programming consistency of the memory devices in an array is achieved.

Figure 10:
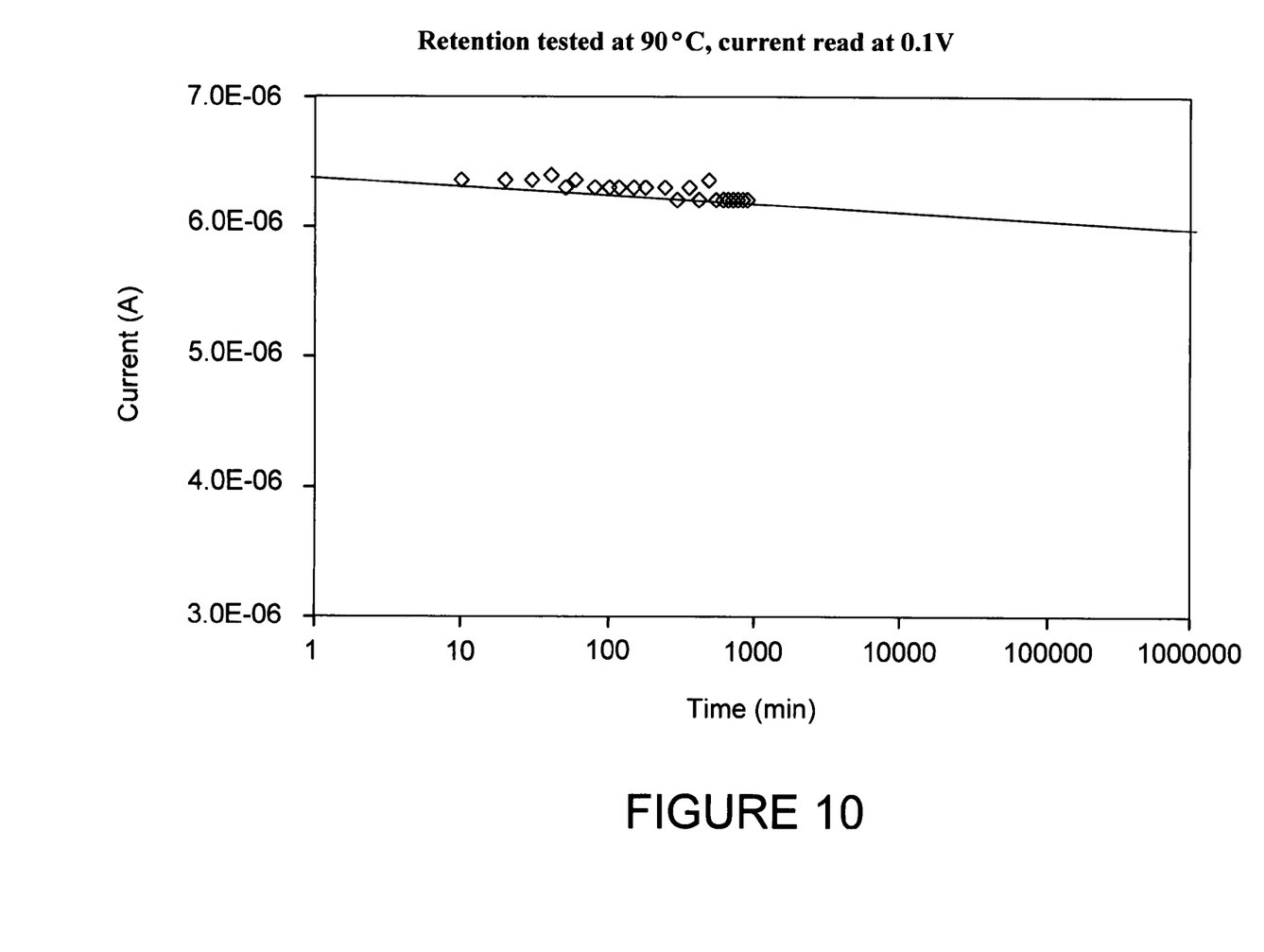
FIG. 10 is a graph illustrating data retention of the device of FIG. 3 when practicing the present method.

Importantly, it has also been found that the present method, utilizing two programming steps as described above, provides greatly improved data retention when compared to the previous approach (see Background Art above). FIG. 10 illustrates data retention times for a programmed device read with $V_r$=1.0 volts applied, and at a temperature of 90° C. As will be seen, read current through a device 130 drops only very slightly over a very long period of time. This clearly indicates that the programmed device 130 retains its conductive, i.e., programmed state over a very long period of time, at high temperature.

In addition the approach provided results in high stability even with substantial variations in operating temperature. That is, the resistance of the memory device achieved upon completion of the two-step programming procedure does not vary substantially with change in temperature.

The present approach allows for different programmed states as will now be described with reference to FIGS. 5-9. Again, positive voltage $V_{pg1}$ is applied to the electrode 138, while the source of the transistor 140 is connected to ground, so that an electrical potential is applied across the electrodes 138, 132 from a higher to a lower potential in the direction from the electrode 138 to the electrode 132 (and in the direction from active layer 136 to the passive layer 134). The voltage $V_{g1}$ applied to the gate of the transistor 140 is set to a level so as to limit current through the device 130 during the first programming operation. However, the voltage $V_{g1}$ applied to the gate of the transistor 140 is at a lower level than as previously described, providing for lower current $I_3$ through the memory device 130 (resulting in higher resistance $R_4$ of the memory device 130 than in the previous example, i.e., $R_4>R_2$) after the first programming step. In the second programming step, with positive voltage $V_{pg1}$ applied to the electrode 138, while the source of the transistor 140 is connected to ground, the voltage $V_{g2}$ applied to the gate of the transistor 140 is set to a level so as to again limit current through the device 130 during the second programming operation. However, the voltage $V_{g2}$ applied to the gate of the transistor 140 is at a lower level than as described in the previous example, providing for lower current $I_4$ through the memory device 130 (resulting in higher resistance $R_5$ of the memory device 130 than in the previous example, i.e., $R_5>R_3$) after the second programming step. It will be understood that by varying the voltages $V_{g1}$ and $V_{g2}$, a variety of different resistive states of the memory device can be achieved as selected. For example, four different memory states can provide two bits of information per memory device as described above.

As will be seen in FIG. 9, and as described above, because of for example slight physical differences between individual memory devices 130, the memory devices 130 will not have exactly the same resistance, i.e., After the first programming step, each resistance will not be exactly equal to $R_4$, but rather there will be a variation range of resistances 204 from memory device to memory device, with the resistance of each memory device falling somewhere within this variation range 204. In fact, because of the relatively large ranges 200 and 204, these ranges can in certain circumstances overlap (illustrated at 208). This can result in, after the first programming step, a "low resistance" memory device 130 having a higher resistance than a "high resistance" memory device, obviously an undesirable situation. Undertaking the second programming step results in much smaller, non-overlapping ranges 202, 206, avoiding the problem caused by this overlap.

In the present example, the memory device 130 is shown and described as adopting any of a plurality of distinct, individual states, allowing the memory device to provide, for example, two or more bits of information.

It will be seen that herein is provided an approach wherein it is insured that the memory device retains its programmed state in a highly stable manner, i.e., with minimal degradation over a long period of time (FIG. 10). This results in a programmed memory device which can be read many times over a long period of time. Furthermore, since maximum programming current through the memory device is low, and programming voltage is also low, the total power in programming the device (power=voltage×current) is low (in comparison to other technologies, for example, flash memory programming). This low power operation is particularly advantageous and desirable in high density memory products, wherein power dissipation can generally be quite high.

Figure 11:
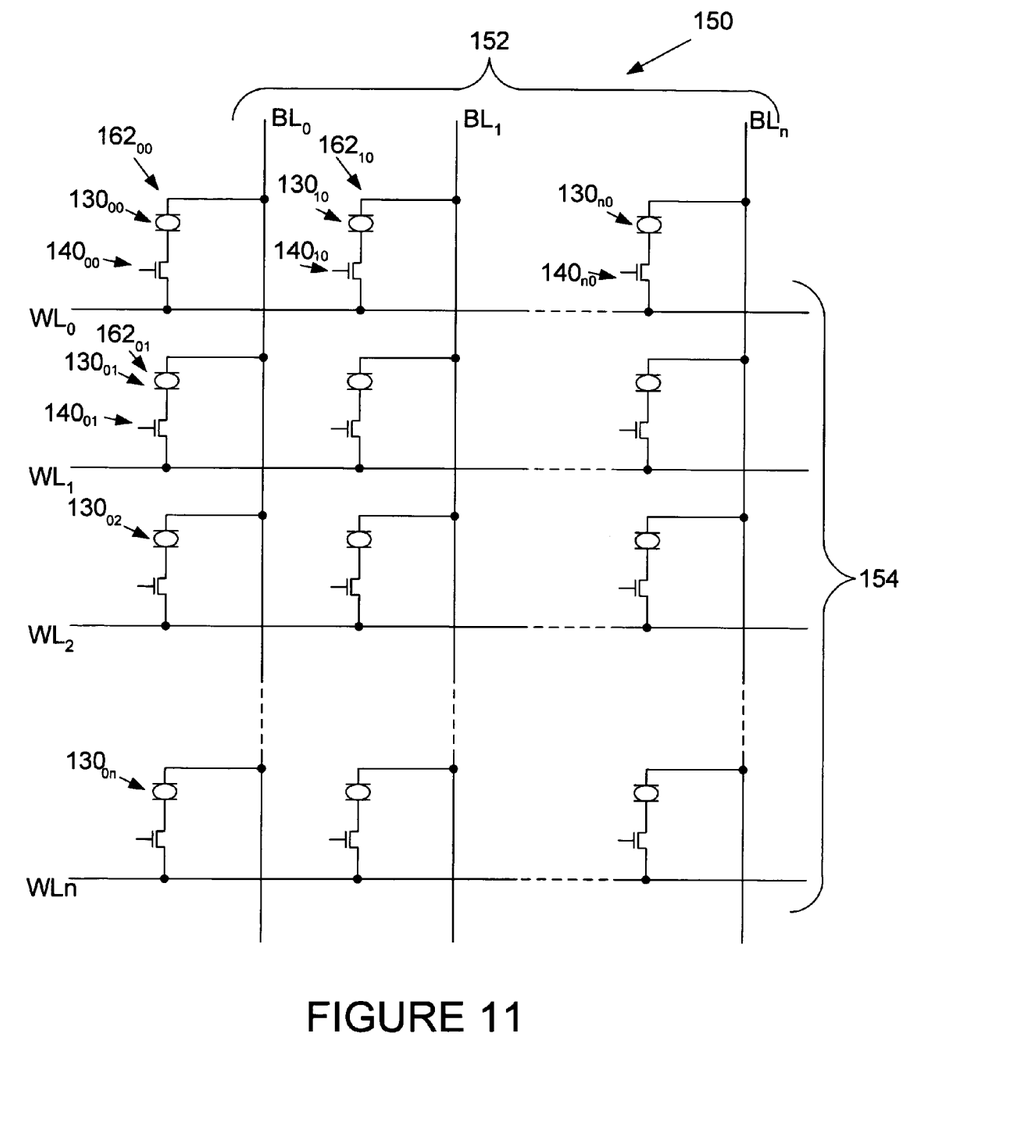
FIG. 11 is a schematic illustration of a memory array incorporating the present invention.

FIG. 11 illustrates a high density memory device array 150 which incorporates memory devices 130 and transistors 140 as described above. As illustrated in FIG. 11, the memory device array 150 includes a first plurality 152 of parallel conductors (bit lines) $BL_0$, $BL_1$, ... $BL_n$, and a second plurality 154 of parallel conductors (word lines) $WL_0$, $WL_1$, ... $WL_n$ overlying and spaced from, orthogonal to, and crossing the first plurality of conductors 152. A plurality of memory devices 130 of the type described above are included, each in series with a transistor 140, to form a memory device-transistor structure 162 connecting a bit line and a word line. Each memory device 130 is connected in series with a transistor 140 between a conductor BL of the first plurality 152 thereof and a conductor WL of the second plurality 154 thereof at the intersection of those conductors. For example, as shown in FIG. 11, memory device $130_{00}$ and transistor $140_{00}$ in series connect conductor $BL_0$ of the first plurality of conductors 152 with conductor $WL_0$ of the second plurality of conductors 154 at the intersection of those conductors $BL_0$, $WL_0$, memory device $130_{10}$ and transistor $140_{10}$ in series connect conductor $BL_1$ of the first plurality of conductors 152 with conductor $WL_0$ of the second plurality of conductors 154 at the intersection of those conductors $BL_1$, $WL_0$, etc. Programming of individual memory devices is achieved in accordance with the above description.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of programming a memory device, the memory device comprising first and second electrodes, a passive layer between the first and second electrodes, and an active layer between the first and second electrodes, the method comprising:
    applying a first electrical potential across the first and second electrodes to reduce the resistance of the memory device, and
    applying a second electrical potential across the first and second electrodes to further reduce the resistance of the memory device, wherein the first electrical potential is applied from higher to lower potential in the direction from the first electrode to the second electrode, and wherein the second electrical potential is applied from higher to lower potential in the direction from the second electrode to the first electrode.

2. The method of claim 1 wherein the second electrical potential is different in magnitude from the first electrical potential.

3. The method of claim 2 wherein the second electrical potential is lower in magnitude than the first electrical potential.

4. A method of programming a memory device, the memory device comprising first and second electrodes, a passive layer between the first and second electrodes, and an active layer between the first and second electrodes, the method comprising:
    applying a first electrical potential across the first and second electrodes from higher to lower potential in the direction from the first electrode to the second electrode, and
    applying a second electrical potential across the first and second electrodes from higher to lower potential in the direction from the second electrode to the first electrode to reduce the resistance of the memory device.

5. The method of claim 4 wherein application of the first electrical reduces the resistance of the memory device.

6. The method of claim 5 wherein application of the second electrical potential further reduces the resistance of the memory device.

7. The method of claim 6 wherein the second electrical potential is different in magnitude from the first electrical potential.

8. The method of claim 7 wherein the second electrical potential is lower in magnitude than the first electrical potential.

9. A method of programming a memory device, the memory device comprising a first electrode, a passive layer on and in contact with the first and second electrodes, an active layer on and in contact with the first and second electrodes, and a second electrode on and in contact with then active layer, the method comprising:
   applying a first electrical potential across the first and second electrodes from higher to lower potential in the direction from the first electrode to the second electrode to reduce the resistance of the memory device, and
   applying a second electrical potential across the first and second electrodes from higher to lower potential in the direction from the second electrode to the first electrode to further reduce the resistance of the memory device.

10. The method of claim 9 wherein the second electrical potential is different in magnitude from the first electrical potential.

11. The method of claim 10 wherein the second electrical potential is lower in magnitude than the first electrical potential.

12. A method of programming a memory device, the memory device comprising first and second electrodes, and an active layer between the first and second electrodes, the method comprising:
   applying a first electrical potential across the first and second electrodes to move electronic charge carriers into the active layer, and
   applying a second electrical potential across the first and second electrodes;
   wherein the first electrical potential is applied across the first and second electrodes from higher to lower potential in the direction from the first electrode to the second electrode, and the second electrical potential is applied across the first and second electrodes from higher to lower potential in the direction from the second electrode to the first electrode.

13. The method of claim 12 wherein application of the first electrical potential reduces the resistance of the memory device.

14. The method of claim 12 wherein application of the second electrical potential further reduces the resistance of the memory device.

15. The method of claim 12 wherein the application of the second electrical potential moves ions into the active layer.

16. The method of claim 12 wherein application of the first electrical potential reduces the resistance of the memory device, and application of the second electrical potential further reduces the resistance of the memory device.

17. The method of claim 12 and further comprising a plurality of said memory devices making up an array thereof.

* * * * *